(12) United States Patent
Costa et al.

(10) Patent No.: US 10,490,471 B2
(45) Date of Patent: Nov. 26, 2019

(54) WAFER-LEVEL PACKAGING FOR ENHANCED PERFORMANCE

(71) Applicant: Qorvo US, Inc., Greensboro, NC (US)

(72) Inventors: Julio C. Costa, Oak Ridge, NC (US); Merrill Albert Hatcher, Jr., Greensboro, NC (US); Peter V. Wright, Portland, OR (US); Jon Chadwick, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/992,639

(22) Filed: May 30, 2018

(65) Prior Publication Data

US 2019/0013255 A1 Jan. 10, 2019

Related U.S. Application Data

(60) Provisional application No. 62/529,016, filed on Jul. 6, 2017.

(51) Int. Cl.
*H01L 23/31* (2006.01)
*H01L 21/56* (2006.01)
(Continued)

(52) U.S. Cl.
CPC .... *H01L 23/3114* (2013.01); *H01L 21/31058* (2013.01); *H01L 21/31133* (2013.01);
(Continued)

(58) Field of Classification Search
CPC ......... H01L 21/561–566; H01L 21/568; H01L 21/78; H01L 21/7806; H01L 24/11; H01L 24/13; H01L 24/94
See application file for complete search history.

(56) References Cited

U.S. PATENT DOCUMENTS 4,093,562 A 6/1978 Kishimoto
4,366,202 A 12/1982 Borovsky
(Continued)

FOREIGN PATENT DOCUMENTS

CN 103811474 A 5/2014
CN 103872012 A 6/2014
(Continued)

OTHER PUBLICATIONS

Non-Final Office Action for U.S. Appl. No. 15/695,579, dated Jan. 28, 2019, 8 pages.
(Continued)

*Primary Examiner* — Zandra V Smith
*Assistant Examiner* — Molly K Reida
(74) *Attorney, Agent, or Firm* — Withrow & Terranova, P.L.L.C.

(57) ABSTRACT

The present disclosure relates to a wafer-level packaging process. According to an exemplary process, a precursor wafer that includes a device layer with a number of input/output (I/O) contacts, a number of bump structures over the device layer, the stop layer underneath the device layer, and a silicon handle layer underneath the stop layer is provided. Herein, each bump structure is electronically coupled to a corresponding I/O contact. A first mold compound is then applied over the device layer to encapsulate each bump structure. Next, the silicon handle layer is removed substantially. A second mold compound is applied to an exposed surface from which the silicon handle layer was removed. Finally, the first mold compound is thinned down to expose a portion of each bump structure.

22 Claims, 7 Drawing Sheets

(51) Int. Cl.
  *H01L 21/78* (2006.01)
  *H01L 23/367* (2006.01)
  *H01L 23/498* (2006.01)
  *H01L 21/3105* (2006.01)
  *H01L 23/00* (2006.01)
  *H01L 23/50* (2006.01)
  *H01L 23/29* (2006.01)
  *H01L 21/762* (2006.01)
  *H01L 21/311* (2006.01)
  *H01L 23/544* (2006.01)

(52) U.S. Cl.
  CPC .......... *H01L 21/561* (2013.01); *H01L 21/565* (2013.01); *H01L 21/568* (2013.01); *H01L 21/76256* (2013.01); *H01L 21/78* (2013.01); *H01L 23/293* (2013.01); *H01L 23/3135* (2013.01); *H01L 23/3171* (2013.01); *H01L 23/367* (2013.01); *H01L 23/50* (2013.01); *H01L 24/05* (2013.01); *H01L 24/11* (2013.01); *H01L 23/544* (2013.01); *H01L 24/03* (2013.01); *H01L 24/13* (2013.01); *H01L 24/94* (2013.01); *H01L 2224/02126* (2013.01); *H01L 2224/02373* (2013.01); *H01L 2224/03002* (2013.01); *H01L 2224/0391* (2013.01); *H01L 2224/03334* (2013.01); *H01L 2224/0401* (2013.01); *H01L 2224/05008* (2013.01); *H01L 2224/05082* (2013.01); *H01L 2224/05567* (2013.01); *H01L 2224/05569* (2013.01); *H01L 2224/05573* (2013.01); *H01L 2224/05639* (2013.01); *H01L 2224/05644* (2013.01); *H01L 2224/05647* (2013.01); *H01L 2224/13017* (2013.01); *H01L 2224/13022* (2013.01); *H01L 2224/13024* (2013.01); *H01L 2224/13082* (2013.01); *H01L 2224/13147* (2013.01); *H01L 2224/94* (2013.01); *H01L 2924/2064* (2013.01); *H01L 2924/20641* (2013.01); *H01L 2924/20642* (2013.01); *H01L 2924/20643* (2013.01)

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,423,570 B1 | 7/2002 | Ma et al. |
| 6,426,559 B1 | 7/2002 | Bryan et al. |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,960,218 B2 | 6/2011 | Ma et al. |
| 8,004,089 B2 | 8/2011 | Jobetto |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |

(56) References Cited

U.S. PATENT DOCUMENTS

| | | |
|---|---|---|
| 2007/0020807 A1 | 1/2007 | Geefay et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Klekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0032957 A1 | 2/2017 | Costa et al. |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0207350 A1 | 7/2017 | Leipold et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0138082 A1 | 5/2018 | Costa et al. |
| 2018/0145678 A1 | 5/2018 | Maxim et al. |
| 2018/0166358 A1 | 6/2018 | Costa et al. |
| 2019/0074263 A1 | 3/2019 | Costa et al. |
| 2019/0074271 A1 | 3/2019 | Costa et al. |
| 2019/0189599 A1 | 6/2019 | Baloglu et al. |

FOREIGN PATENT DOCUMENTS

| | | |
|---|---|---|
| EP | 2996143 A1 | 3/2016 |
| JP | S505733 Y1 | 2/1975 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Notice of Allowance for U.S. Appl. No. 15/695,579, dated Mar. 20, 2019, 8 pages.

Non-Final Office Action for U.S. Appl. No. 15/992,613, dated Feb. 27, 2019, 15 pages.

International Preliminary Report on Patentability for PCT/US2017/046744, dated Feb. 21, 2019, 11 pages.

International Preliminary Report on Patentability for PCT/US2017/046758, dated Feb. 21, 2019, 11 pages.

International Preliminary Report on Patentability for PCT/US2017/046779, dated Feb. 21, 2019, 11 pages.

First Office Action for Chinese Patent Application No. 201510746323.X, dated Nov. 2, 2018, 12 pages.

(56) References Cited

OTHER PUBLICATIONS

Notice of Allowance for U.S. Appl. No. 16/038,879, dated Jan. 9, 2019, 8 pages.
Non-Final Office Action for U.S. Appl. No. 15/945,418, dated Nov. 1, 2018, 13 pages.
Final Office Action for U.S. Appl. No. 15/601,858, dated Nov. 26, 2018, 16 pages.
Advisory Action for U.S. Appl. No. 15/601,858, dated Jan. 22, 2019, 3 pages.
Notice of Allowance for U.S. Appl. No. 16/004,961, dated Jan. 11, 2019, 8 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.

(56) References Cited

OTHER PUBLICATIONS

Author Unknown, "CoolPoly E3605 Thermally Conductive Polyamide 4,6 (PA 4,6)," Cool Polymers, Inc., Aug. 1, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Non-Final Office Action for U.S. Appl. No. 15/676,693, dated May 3, 2018, 14 pages.

(56) References Cited

OTHER PUBLICATIONS

Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/914,538, dated Aug. 1, 2018, 9 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Notice of Allowance for U.S. Appl. No. 16/004,961, dated May 13, 2019, 8 pages.
Final Office Action for U.S. Appl. No. 15/992,613, dated May 24, 2019, 11 pages.
Non-Final Office Action for U.S. Appl. No. 15/601,858, dated Apr. 17, 2019, 9 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Notice of Reasons for Refusal for Japanese Patent Application No. 2015-180657, dated Jul. 9, 2019, 4 pages.
Notice of Allowance for U.S. Appl. No. 15/975,230, dated Jul. 22, 2019, 7 pages.
Notice of Allowance for U.S. Appl. No. 15/601,858, dated Aug. 16, 2019, 8 pages.
Notice of Allowance for U.S. Appl. No. 16/004,961, dated Aug. 28, 2019, 8 pages.
Advisory Action for U.S. Appl. No. 15/992,613, dated Jul. 29, 2019, 3 pages.

(56) References Cited

OTHER PUBLICATIONS

Final Office Action for U.S. Appl. No. 15/873,152, dated Aug. 8, 2019, 13 pages.
International Search Report and Written Opinion for International Patent Application No. PCT/US19/25591, dated Jun. 21, 2019, 7 pages.
International Search Report and Written Opinion for International Patent Application No. PCT/US2019/034645, dated Sep. 19, 2019, 14 pages.
Notice of Alloawance for U.S. Appl. No. 15/992,613, dated Sep. 23, 2019, 7 pages.
Non-Final Office Action for U.S. Appl. No. 16/204,214, dated Oct. 9, 2019, 15 pages.
Advisory Action for U.S. Appl. No. 15/873,152, dated Oct. 11, 2019, 3 pages.

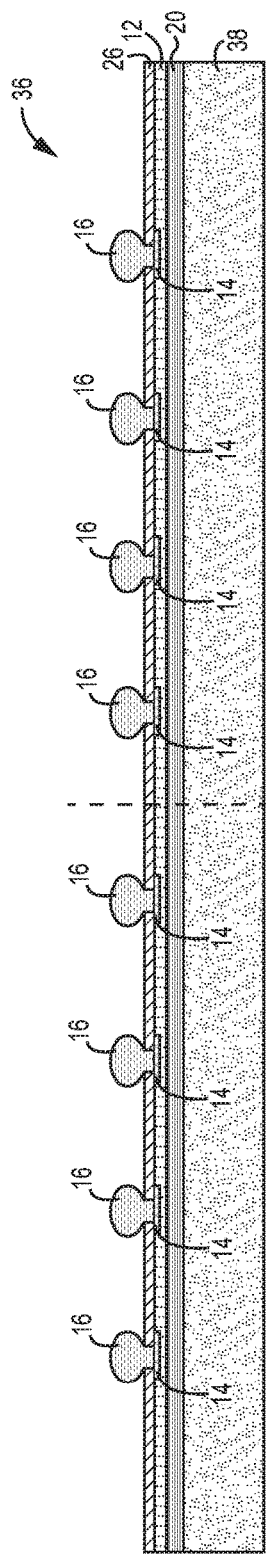
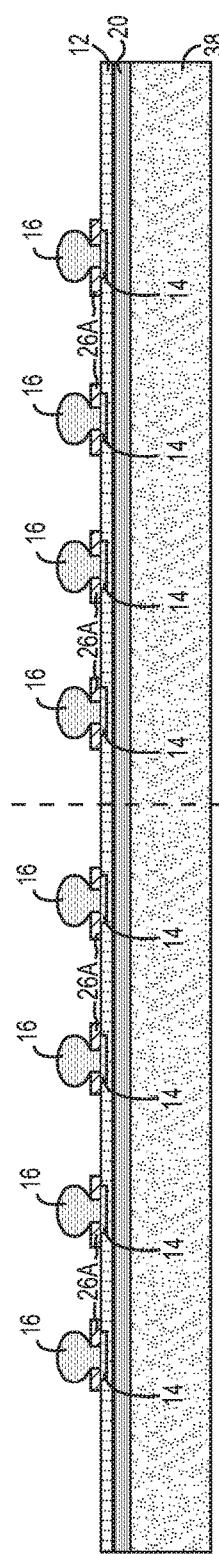
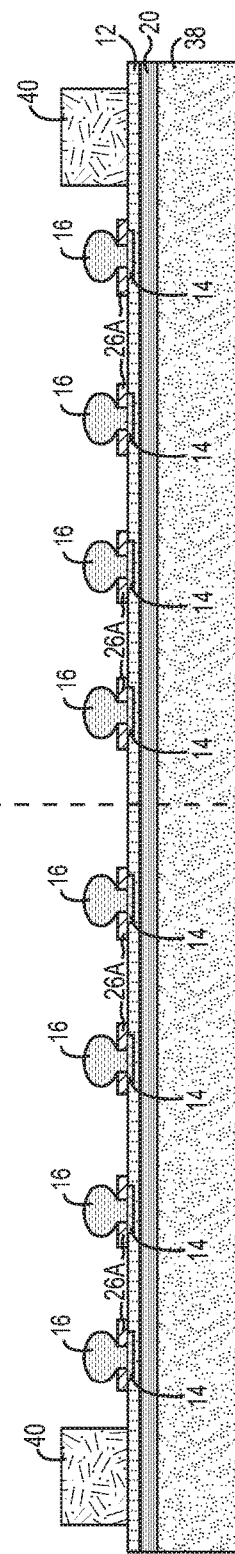
FIG. 4
FIG. 5
FIG. 6

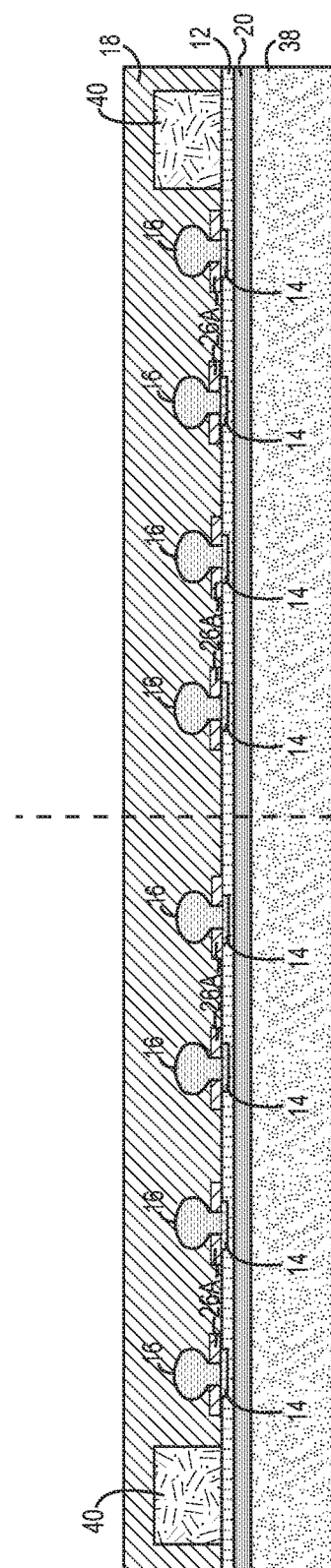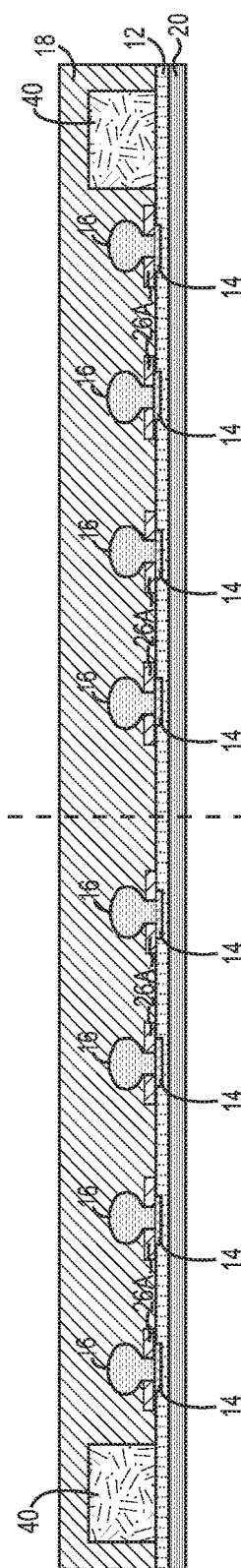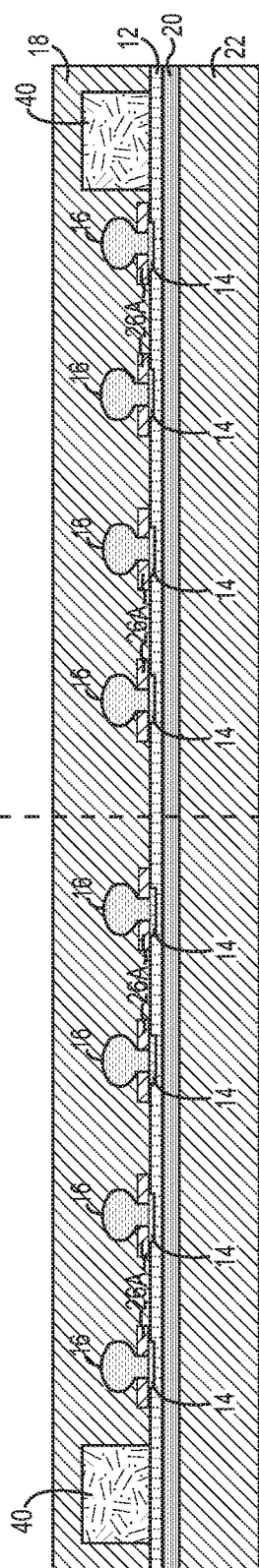

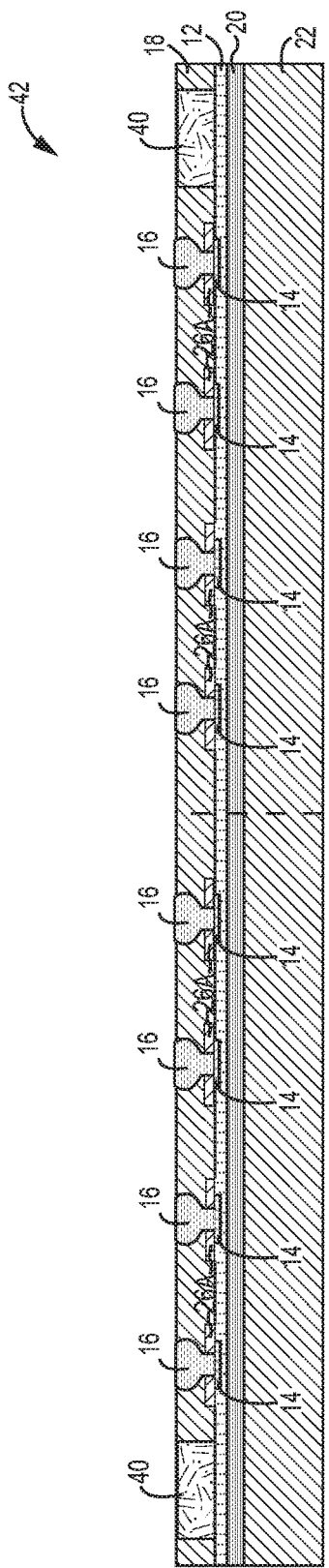
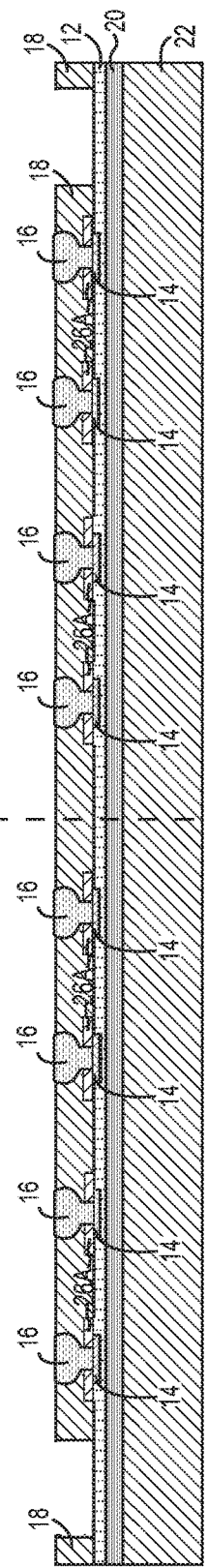

WAFER-LEVEL PACKAGING FOR ENHANCED PERFORMANCE

RELATED APPLICATIONS

This application claims the benefit of provisional patent application Ser. No. 62/529,016, filed Jul. 6, 2017, the disclosure of which is hereby incorporated herein by reference in its entirety.

This application is related to U.S. patent application Ser. No. 15/992,613, filed May 30, 2019, entitled "WAFER-LEVEL PACKAGING FOR ENHANCED PERFORMANCE;" the disclosure of which is hereby incorporated herein by reference in its entirety.

FIELD OF THE DISCLOSURE

The present disclosure relates to a mold module and a process for making the same, and more particularly to a mold module with enhanced thermal and electrical performance, and a wafer-level packaging process to provide the mold module with enhanced performance.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low cost of silicon materials, a large scale capacity of wafer production, well-established semiconductor design tools, and well-established semiconductor manufacturing techniques.

Despite the benefits of using conventional silicon substrates for the RF device fabrications, it is well known in the industry that the conventional silicon substrates may have two undesirable properties for the RF devices: harmonic distortion and low resistivity values. The harmonic distortion is a critical impediment to achieve high level linearity in the RF devices built over silicon substrates. In addition, the low resistivity encountered in the silicon substrates may degrade quality factors (Q) at high frequencies of microelectromechanical systems (MEMS) or other passive components.

In addition, high speed and high performance transistors are more densely integrated in RF devices. Consequently, the amount of heat generated by the RF devices will increase significantly due to the large number of transistors integrated in the RF devices, the large amount of power passing through the transistors, and the high operation speed of the transistors. Accordingly, it is desirable to package the RF devices in a configuration for better heat dissipation.

To accommodate the increased heat generation of the RF devices and to reduce deleterious harmonic distortion of the RF devices, it is therefore an object of the present disclosure to provide an improved packaging process for enhanced thermal and electrical performance. Further, there is also a need to enhance the performance of the RF devices without increasing the package size.

SUMMARY

The present disclosure relates to a wafer-level packaging process to provide mold modules with enhanced performance. According to an exemplary wafer-level packaging process, a precursor wafer that includes a device layer, a number of first bump structures, a stop layer, and a silicon handle layer is provided. Herein, the device layer has a number of input/output (I/O) contacts at a top surface of the device layer. Each first bump structure is over the top surface of the device layer and electronically coupled to a corresponding I/O contact. The stop layer resides underneath the device layer, and a silicon handle layer resides underneath the stop layer, such that the stop layer separates the device layer from the silicon handle layer. A first mold compound is then applied over the device layer to encapsulate each first bump structure. Next, the silicon handle layer is removed substantially. A second mold compound is applied to an exposed surface from which the silicon handle layer was removed. Finally, the first mold compound is thinned down to provide a mold wafer. A portion of each first bump structure is exposed through the first mold compound.

In one embodiment of the wafer-level packaging process, removing substantially the silicon handle layer is provided by one of chemical mechanical grinding, wet etching, and dry etching.

In one embodiment of the wafer-level packaging process, applying the first mold compound is provided by one of compression molding, sheet molding, overmolding, transfer molding, dam fill encapsulation, and screen print encapsulation.

In one embodiment of the wafer-level packaging process, applying the second mold compound is provided by one of compression molding, sheet molding, overmolding, transfer molding, dam fill encapsulation, and screen print encapsulation.

In one embodiment of the wafer-level packaging process, thinning down the first mold compound is provided by mechanical grinding.

According to another embodiment, the wafer-level packaging process further includes forming a number of second bump structures over the first mold compound after the first mold compound is thinned down. Herein, each second bump structure is in contact with a corresponding first bump structure.

According to another embodiment, the wafer-level packaging process further includes singulating the mold wafer into individual mold modules.

In one embodiment of the wafer-level packaging process, the silicon handle layer, the stop layer, and the device layer are formed from a silicon-on-insulator (SOI) structure. Herein, the silicon handle layer is a silicon substrate of the SOI structure, the stop layer is a buried oxide (BOX) layer of the SOI structure, and the device layer is formed from a silicon epitaxy layer of the SOI structure.

In one embodiment of the wafer-level packaging process, the device layer provides one of a microelectromechanical systems (MEMS) device, an integrated passive device, and an active device.

In one embodiment of the wafer-level packaging process, the precursor wafer further includes a passivation layer formed over the device layer. Herein, a portion of each I/O contact is exposed through the passivation layer and each first bump structure protrudes from a top surface of the passivation layer and is coupled to the exposed portion of a corresponding I/O contact through the passivation layer.

According to another embodiment, the wafer-level packaging process further includes patterning the passivation layer to form a number of discrete passivation pads before applying the first mold compound over the device layer. Herein, each discrete passivation pad is aligned over a corresponding I/O contact. A portion of each I/O contact is exposed through a corresponding discrete passivation pad.

Each first bump structure protrudes from a top surface of the corresponding discrete passivation pad and is coupled to the exposed portion of a corresponding I/O contact through the corresponding discrete passivation pad. Each discrete passivation pad is encapsulated by the first mold compound.

In one embodiment of the wafer-level packaging process, patterning the passivation layer is provided by photo masking or stencil screening.

In one embodiment of the wafer-level packaging process, the passivation layer is formed of benzocyclobutene (BCB) or polyimide.

According to another embodiment, the wafer-level packaging process further includes forming at least one window component over the device layer before applying the first mold compound over the device layer. The at least one window component is not in contact with the first bump structures. The at least one window component has a height greater than each first bump structure. The window component is encapsulated by the first mold compound.

In one embodiment of the wafer-level packaging process, a portion of the at least one window component is exposed after thinning down the first mold compound.

In one embodiment of the wafer-level packaging process, the at least one window component is transparent.

According to another embodiment, the wafer-level packaging process further includes removing the at least one window component to expose a portion of the top surface of the device layer after the first mold compound is thinned down.

In one embodiment of the wafer-level packaging process, the precursor wafer further includes a redistribution structure formed over the device layer. Herein, each first bump structure protrudes from a top surface of the redistribution structure. The redistribution structure includes redistribution interconnects that connect the I/O contacts to certain ones of the first bump structures. The first mold compound resides over the redistribution structure.

In one embodiment of the wafer-level packaging process, the first mold compound is formed from a same material as the second mold compound.

In one embodiment of the wafer-level packaging process, the first mold compound and the second mold compound have a thermal conductivity greater than 1 W/m·K. The first mold compound and the second mold compound have a dielectric constant between 3 and 5.

In one embodiment of the wafer-level packaging process, the first mold compound and the second mold compound have a thermal conductivity greater than 1 W/m·K. The first mold compound and the second mold compound have a dielectric constant less than 7.

In one embodiment of the wafer-level packaging process, the first mold compound and the second mold compound are formed from different materials.

In one embodiment of the wafer-level packaging process, the first mold compound is transparent.

In one embodiment of the wafer-level packaging process, the stop layer is formed of at least one of silicon oxide or silicon nitride.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2A:
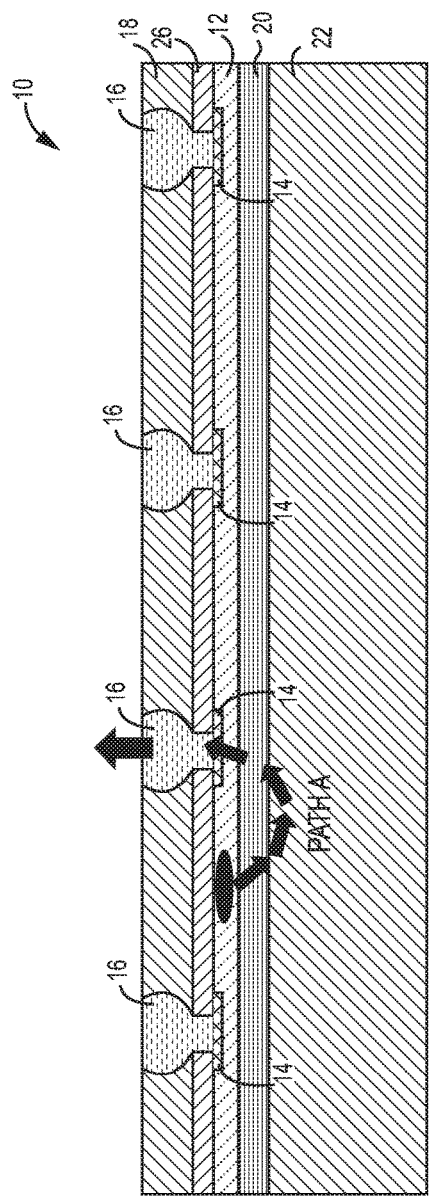
FIGS. 2A-2B show alternative exemplary mold modules with enhanced thermal and electrical performance according to one embodiment of the present disclosure.
Figure 2B:
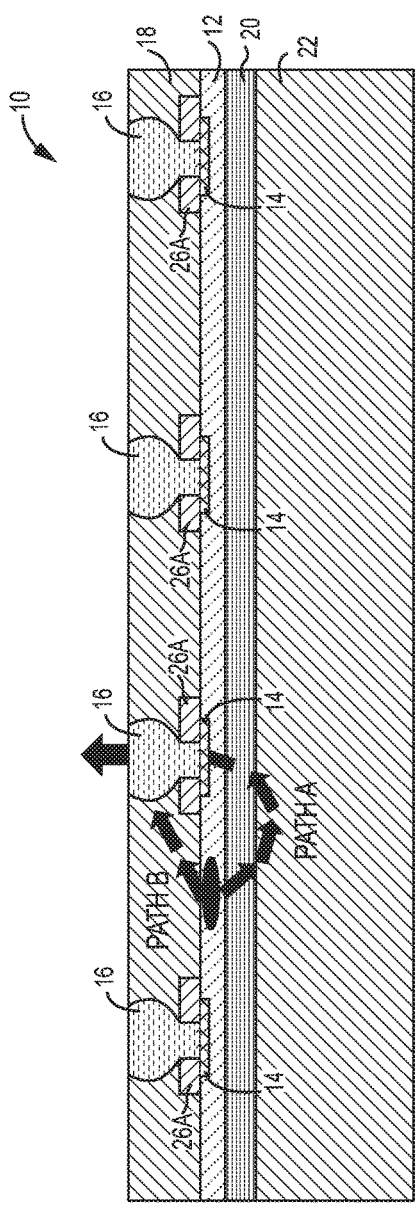

FIGS. 4-11 provide an exemplary wafer-level packaging process that illustrates steps to fabricate the exemplary mold module shown in FIG. 2B.

It will be understood that for clear illustrations, FIGS. 1A-11 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1A:
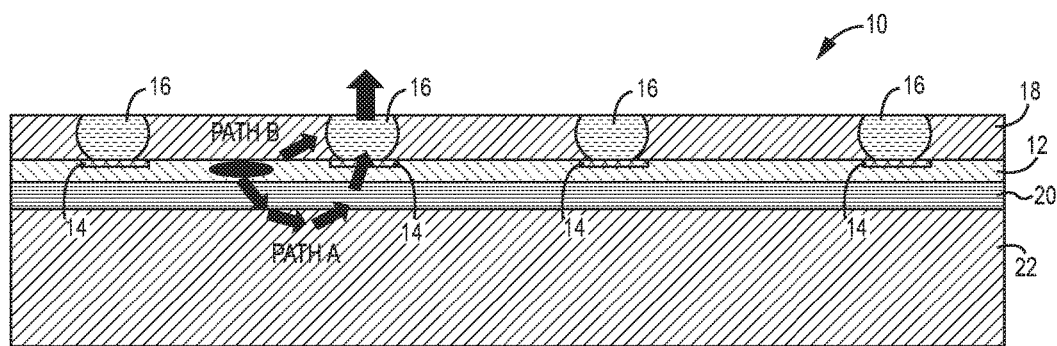
FIGS. 1A-1C show exemplary mold modules with enhanced thermal and electrical performance according to one embodiment of the present disclosure.

The present disclosure relates to a mold module with enhanced thermal and electrical performance, and a wafer-level packaging process to provide the mold module with enhanced performance. FIG. 1A shows an exemplary mold module 10 according to one embodiment of the present disclosure. For the purpose of this illustration, the exemplary mold module 10 includes a device layer 12 with a number of input/output (I/O) contacts 14, a number of first bump structures 16, a first mold compound 18, a stop layer 20, and a second mold compound 22.

In detail, the I/O contacts 14 are located at a top surface of the device layer 12. The device layer 12 may include at least one of a microelectromechanical systems (MEMS) device, an integrated passive device, and an active device (not shown), which may generate heat in the device layer 12. Each first bump structure 16 is formed over the device layer 12 and in contact with a corresponding I/O contact 14. The first mold compound 18 resides over the device layer 12 and partially encapsulates each first bump structure 16, such that a portion of each first bump structure 16 is exposed through the first mold compound 18. The stop layer 20 is formed underneath the device layer 12 and the second mold compound 22 resides underneath the stop layer 20, such that the stop layer 20 separates the device layer 12 from the second mold compound 22.

The I/O contacts 14 at the top surface of the device layer 12 may be formed of copper, silver, gold or other conductive metals, and the first bump structures 16 are solder balls. As such, each first bump structure 16 and the corresponding I/O contact 14 are electronically coupled. The stop layer 20 may be formed of at least one of silicon oxide or silicon nitride. The heat generated in the device layer 12 may travel through path A and/or path B. For the path A, the heat will travel downward to a top portion of the second mold compound 22, then will pass upward through the stop layer 20, the device layer 12, and the first bump structures 16, which will dissipate the heat. For the path B, the heat will travel directly through the first mold compound 18 to be conducted. It is therefore highly desirable to have high thermal conductivities of both the first and second mold compounds 18 and 22. The first mold compound 18 and the second mold compound 22 may have a thermal conductivity greater than 1 W/m·K, or greater than 10 W/m·K. In addition, the first mold compound 18 and the second mold compound 22 may have a low dielectric constant less than 7, or between 3 and 5 to yield low radio frequency (RF) coupling between devices (not shown) within the device layer 12. The first mold compound 18 may be formed of a same or different material as the second mold compound 22. The first mold compound 18 may be transparent. In one embodiment, both the first mold compound 18 and the second mold compound 22 may be formed of thermoplastics or thermoset polymer materials, such as PPS (poly phenyl sulfide), overmold epoxies doped with boron nitride or alumina thermal additives, or the like. The device layer has a thickness between 0.1 μm and 50 μm, the stop layer has a thickness between 10 nm and 1000 nm, the first mold compound has a thickness between 10 μm and 1000 μm, and the second mold compound has a thickness between 200 μm and 500 μm.

Figure 1B:
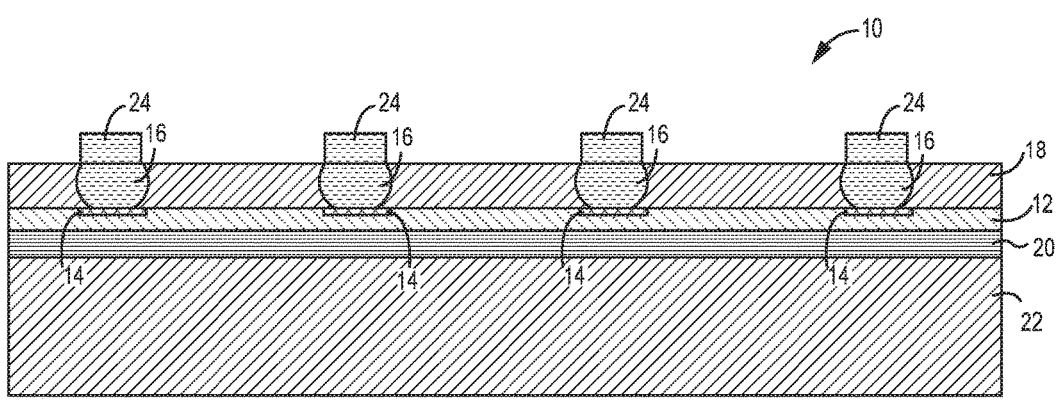
Figure 1C:
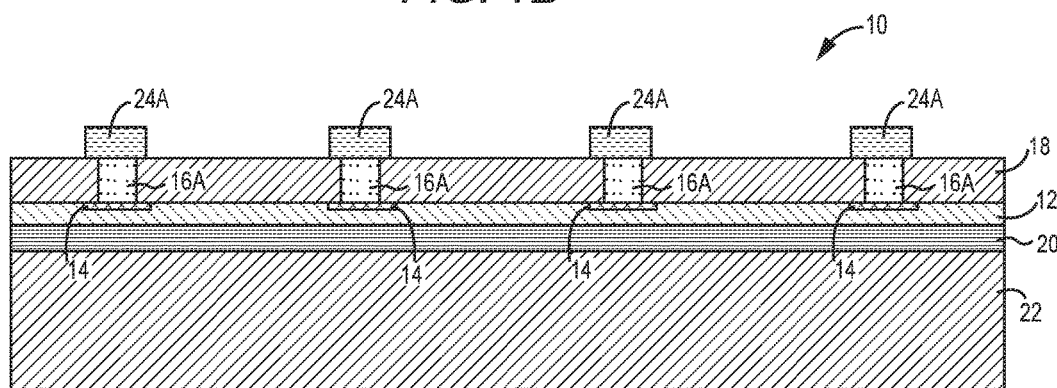

Herein, the mold module 10 has a planar top surface, where the first bump structures 16 do not protrude from the top surface of the first mold compound 18. In some applications, it would be desirable to have protruding structures at the top surface of the mold module 10 to facilitate and improve the reliability of die attaching (to the printed circuit board) operations. As shown in FIG. 1B, the mold module 10 may further include a number of second bump structures 24. Each second bump structure 24 is in contact with a corresponding first bump structure 16, and protrudes from the top surface of the first mold compound 18. The second bump structures 24 may be formed from solder paste, such that one I/O contact 14, the corresponding first bump structure 16, and the corresponding second bump structure 24 are electronically coupled. In some applications, the mold module 10 utilizes copper pillars instead of solder balls for first bump structures 16A as illustrated in FIG. 1C. Further, second bump structures 24A may be formed from conductive epoxy or reflowable metals: such as gold, silver, and alloy. Each I/O contact 14, the corresponding first bump structure 16, and the corresponding second bump structure 24 are electronically coupled.

In another embodiment, the mold module 10 may further include a passivation layer 26 as illustrated in FIG. 2A. The passivation layer 26 is formed over the device layer 12 and a portion of each I/O contact 14 is exposed through the passivation layer 12. Each first bump structure 16 protrudes from a top surface of the passivation layer 26 and is coupled to the exposed portion of the corresponding I/O contact 14 through the passivation layer 26. The first mold compound 18 resides over the passivation layer 26, partially encapsulates each first bump structure 16, and is not in contact with the first mold compound 18. The passivation layer 26 may be formed of benzocyclobutene (BCB) or polyimide, and has a thickness between 5 nm and 5000 nm.

It is clear to those skilled in the art, this passivation layer 26 may help to mitigate the stresses associated with the module attaching process. However, the passivation layer 26 may have poor thermal conductivity, so as to obstruct the heat generated in the device layer 12 conducting through the first mold compound 18 (no path B). Alternatively, the mold module 10 may include a number of discrete passivation pads 26A instead of the continuous passivation layer 26 formed between the device layer 12 and the first mold compound 18, as illustrated in FIG. 2B. Herein, the discrete passivation pads 26A do not fully cover the device layer 12 and portions of the device layer 12 are in contact with the first mold compound 18. Each I/O contact 14 is aligned underneath a corresponding discrete passivation pad 26A, a portion of each I/O contact 14 is exposed through the corresponding discrete passivation pad 26A, and no I/O contact 14 is in contact with the first mold compound 18. Each first bump structure 16 protrudes from a top surface of the corresponding discrete passivation pad 26A and is coupled to the exposed portion of the corresponding I/O contact 14 through the corresponding discrete passivation pad 26A. The discrete passivation pads 26A may be formed of BCB or polyimide, and each discrete passivation pad 26A has a thickness between 5 nm and 5000 nm.

Herein, the discrete passivation pads 26A do not separate the device layer 12 from the first mold compound 18. As such, the heat generated in the device layer 12 may travel through path A (from the device layer 12 downward to the top portion of the second mold compound 22, then upward through the stop layer 20, the device layer 12, and the first bump structures 16) and/or path B (from the device layer 12 directly through the first mold compound 18).

Figure 3:
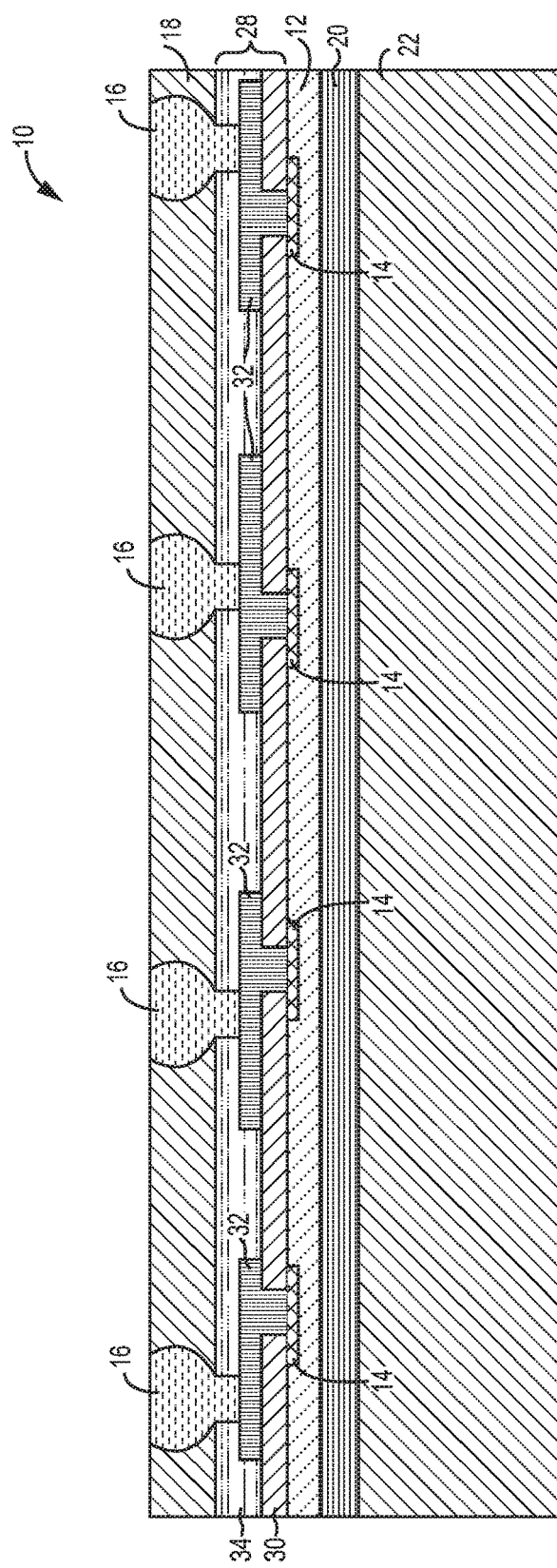
FIG. 3 shows an alternative mold module with enhanced thermal and electrical performance according to one embodiment of the present disclosure.

In some applications, the mold module 10 may further include a redistribution structure 28 formed between the device layer 12 and the first mold compound 18, as illustrated in FIG. 3. The redistribution structure 28 includes a first dielectric layer 30, a number of redistribution interconnects 32, and a second dielectric layer 34. The first dielectric layer 30 resides over the device layer 12 and a portion of each I/O contact 14 is exposed through the first dielectric layer 30. Each redistribution interconnect 32 is connected to certain one(s) of the I/O contacts 14 and extends over the first dielectric layer 30. The second dielectric layer 34 resides over the first dielectric layer 30 to partially encapsulate each redistribution interconnect 32, such that a portion of each redistribution interconnect 32 is exposed through the second dielectric layer 34. Each first bump structure 16 protrudes from a top surface of the redistribution structure 28 and is electronically coupled to certain one(s) of the I/O contacts 14 via the redistribution interconnects 32. The first and second dielectric layers 30 and 34 may be formed of BCB or polyimide, and the redistribution interconnects 32 may be formed of copper or other suitable metals. The redistribution structure 28 has a thickness between 2 μm and 300 μm.

FIGS. 4-11 provide an exemplary wafer-level packaging process that illustrates steps to fabricate the exemplary mold module 10 shown in FIG. 2B. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 4-11.

Initially, a precursor wafer 36 is provided as illustrated in FIG. 4. The precursor wafer 36 includes a silicon handle layer 38, the stop layer 20, the device layer 12 with the I/O contacts 14 at the top surface of the device layer 12, the first bump structures 16, and the passivation layer 26. The passivation layer 26 is formed over the device layer 12 and a portion of each I/O contact 14 is exposed through the passivation layer 12. Each first bump structure 16 protrudes from the top surface of the passivation layer 26 and is coupled to the exposed portion of the corresponding I/O contact 14 through the passivation layer 26. The stop layer 20 is formed underneath the device layer 12 and the silicon handle layer 38 resides underneath the stop layer 20, such that the stop layer 20 separates the device layer 12 from the silicon handle layer 38. Herein, the silicon handle layer 38 may have a thickness between 200 μm and 500 μm and a relatively high dielectric constant greater than 7. In some applications, the silicon handle layer 38, the stop layer 20, and the device layer 12 may be formed from a silicon-on-insulator (SOI) structure, which refers to a structure including a silicon substrate, a silicon epitaxy layer, and a buried oxide (BOX) layer sandwiched between the silicon substrate and the silicon epitaxy layer. The silicon handle layer 38 is the silicon substrate of the SOI structure, the stop layer 20 is the BOX layer of the SOI structure, and the device layer 12 is formed from the silicon epitaxy layer of the SOI structure. In some applications, the precursor wafer 36 may not include the passivation layer 26. As such, each first bump structure 16 is formed over the device layer 12 and in contact with a corresponding I/O contact 14.

The passivation layer 26 is then patterned to form the discrete passivation pads 26A as illustrated in FIG. 5. Herein, the discrete passivation pads 26A do not fully cover the device layer 12. Portions of the device layer 12 are exposed through the discrete passivation pads 26A. Each discrete passivation pad 26A is aligned over a corresponding I/O contact 14, and a portion of each I/O contact 14 is exposed through a corresponding discrete passivation pad 26A. Each first bump structure 16 protrudes from a top surface of the corresponding discrete passivation pad 26A and is coupled to the exposed portion of the corresponding I/O contact 14 through the corresponding discrete passivation pad 26A. Patterning the passivation layer 26 may be provided by a lithography procedure, such as photo masking or stencil screening. If there is no passivation layer 26 included in the precursor wafer 36, the patterning process will be omitted.

Next, at least one window component 40 may be formed over the device layer 12 at where the wafer mark(s) (not shown) is/are located as illustrated in FIG. 6. Herein, the wafer mark indicates the key location(s) of a wafer, which will be utilized for alignment in a following singulation and/or an assembly process. In one embodiment, the at least one window component 40 is located at the periphery of the device layer 12. The at least one window component 40 may be formed of a transparent material (for instance: transparent silicone material), such that the wafer mark will be seen through the at least one window component 40. In addition, at least one window component 40 may be formed of an easily removable material (for instance: acrylic polymer), such that the wafer mark will be seen after the easy removal of the at least one window component 40 (more details in following discussion). The at least one window component 40 has a height greater than each first bump structure 16 and is not connected to any first bump structure 16. Notice that the at least one window component 40 is optional. In some applications, forming the at least one window component 40 over the device layer 12 may be omitted.

The first mold compound 18 is applied over the device layer 12 to encapsulate each first bump structure 16 and the at least one window component 40, as illustrated in FIG. 7. The first mold compound 18 may be applied by various procedures, such as compression molding, sheet molding, overmolding, transfer molding, dam fill encapsulation, or screen print encapsulation. The first mold compound 18 may have a superior thermal conductivity greater than 1 W/m·K, or greater than 10 W/m·K, and may have a dielectric constant less than 7, or between 3 and 5. The first mold compound 18 may resist etching chemistries such as potassium hydroxide (KOH), sodium hydroxide (NaOH), and acetylcholine (ACH). In some applications, the first mold compound 18 may be formed of a transparent material. As such, there is no need to form the at least one window component 40 over the device layer 12, because all locations of a wafer may be seen through the first mold compound 18. A curing process (not shown) is then used to harden the first mold compound 18. The curing temperature is between 100° C. and 320° C. depending on which material is used as the first mold compound 18.

After the first mold compound 18 is formed, the silicon handle layer 38 is removed substantially as illustrated in FIG. 8. Herein, removing substantially the silicon handle layer 38 refers to removing at least 95% of the entire silicon handle layer 38 and remaining at most 2 μm of the silicon handle layer 38. In desired cases, the silicon handle layer 38 is removed completely, such that the stop layer 20 is exposed. Removing substantially the silicon handle layer 38 may be provided by an chemical mechanical grinding process or an etching process with a wet/dry etchant chemistry, which may be TMAH, KOH, ACH, NaOH, or the like. During the removal process, the first mold compound 18 protects the top surface of the device layer 12, while the stop layer 20 protects a bottom surface of the device layer 12.

The second mold compound 22 is then applied to an exposed surface from which the silicon handle layer 38 was removed, as illustrated in FIG. 9. If the silicon handle layer 38 is removed completely, the second mold compound 22 is in contact with the stop layer 20. The second mold compound 22 may be applied by various procedures, such as compression molding, sheet molding, overmolding, transfer molding, dam fill encapsulation, and screen print encapsulation. A curing process (not shown) is followed to harden the second mold compound 22. The curing temperature is between 100° C. and 320° C. depending on which material is used as the second mold compound 22. After the curing process, a bottom surface of the second mold compound 22 may be planarized (not shown).

Figure 10C:
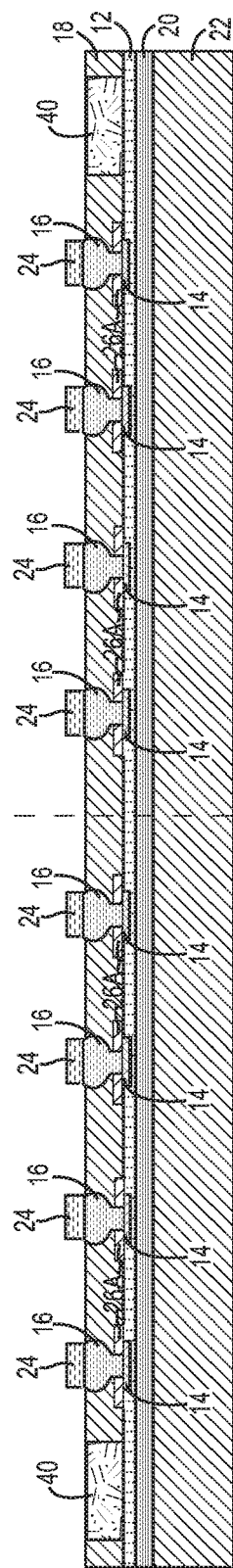

Next, the first mold compound 18 is thinned down to provide a mold wafer 42 as illustrated in FIG. 10A. Herein, a portion of each first bump structure 16 is exposed. Since the at least one window component 40 has a height greater than each first bump structure 16, a portion of the at least one window component 40 is also exposed through the first mold compound 18. The thinning procedure may be done with a mechanical grinding process. In one embodiment, the at least one window component 40 may be formed of a transparent material, such that the wafer mark indicating the key location(s) of a wafer will be seen through the at least one window component 40. In another embodiment, the at least one window component 40 may be formed of an opaque material, such that the wafer mark indicating the key location(s) of a wafer will not be seen through the at least one window component 40. An extra step to remove the at least one window component 40 is needed, as illustrated in FIG. 10B. After the removal step, at least one portion of the top surface of the device layer 12 is exposed. As such, the wafer mark indicating the key location(s) of a wafer will be seen. Further, in some applications, the second bump structures 24 may be formed after the first mold compound 18 is thinned down, as illustrated in FIG. 10C. Each second bump structure 24 is formed over a corresponding first bump structure 16, and electronically coupled to a corresponding I/O contact 14 via the corresponding first bump structure 16.

Figure 11:
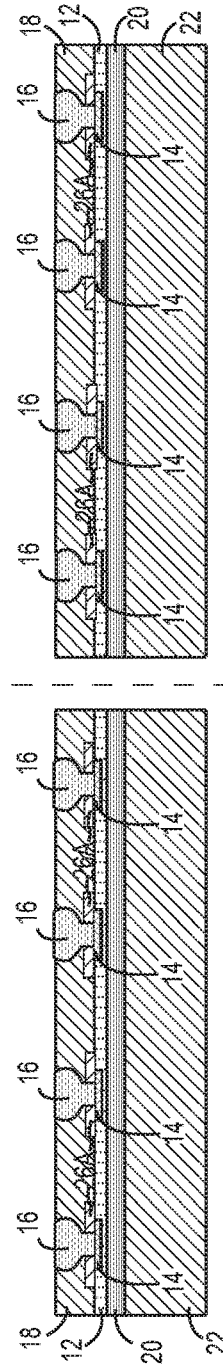

Finally, the mold wafer 42 is singulated into individual mold modules 10, as illustrated in FIG. 11. The singulating step may be provided by a probing and dicing process. The individual mold module 10 may be assembled on the PCB using a number of die attaching methods.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
providing a precursor wafer that includes a silicon handle layer, a stop layer, a device layer, and a plurality of first bump structures, wherein:
the device layer has a plurality of input/output (I/O) contacts at a top surface of the device layer;
the plurality of first bump structures are formed over the device layer, wherein each of the plurality of first bump structures is electronically coupled to a corresponding I/O contact;
the stop layer resides underneath the device layer; and
the silicon handle layer resides underneath the stop layer, such that the stop layer separates the device layer from the silicon handle layer;
applying a first mold compound over the device layer to encapsulate each of the plurality of first bump structures;
removing substantially the silicon handle layer;
applying a second mold compound to an exposed surface from which the silicon handle layer was removed; and
thinning down the first mold compound to provide a mold wafer, wherein a portion of each of the plurality of first bump structures is exposed.

2. The method of claim 1 wherein removing substantially the silicon handle layer is provided by one of a group consisting of chemical mechanical grinding, wet etching, and dry etching.

3. The method of claim 1 wherein applying the first mold compound is provided by one of a group consisting of compression molding, sheet molding, overmolding, transfer molding, dam fill encapsulation, and screen print encapsulation.

4. The method of claim 1 wherein applying the second mold compound is provided by one of a group consisting of compression molding, sheet molding, overmolding, transfer molding, dam fill encapsulation, and screen print encapsulation.

5. The method of claim 1 wherein thinning down the first mold compound is provided by mechanical grinding.

6. The method of claim 1 further comprising forming a plurality of second bump structures over the first mold compound after the first mold compound is thinned down, wherein each of the plurality of second bump structures is in contact with a corresponding first bump structure.

7. The method of claim 1 further comprising singulating the mold wafer into individual mold modules.

8. The method of claim 1, wherein the silicon handle layer, the stop layer, and the device layer are formed from a silicon-on-insulator (SOI) structure, wherein the silicon handle layer is a silicon substrate of the SOI structure, the stop layer is a buried oxide (BOX) layer of the SOI structure, and the device layer is formed from a silicon epitaxy layer of the SOI structure.

9. The method of claim 1, wherein the device layer provides one of a group consisting of a microelectromechanical systems (MEMS) device, an integrated passive device, and an active device.

10. The method of claim 1, wherein the precursor wafer further comprises a passivation layer formed over the device layer, wherein a portion of each of the plurality of I/O contacts is exposed through the passivation layer and each of the plurality of first bump structures protrudes from a top surface of the passivation layer and is coupled to the exposed portion of a corresponding I/O contact through the passivation layer.

11. The method of claim 10 further comprising patterning the passivation layer to form a plurality of discrete passivation pads before applying the first mold compound over the device layer, wherein:
- each of plurality of discrete passivation pads is aligned over a corresponding I/O contact;
- a portion of each of the plurality of I/O contacts is exposed through a corresponding discrete passivation pad;
- each of the plurality of first bump structures protrudes from a top surface of the corresponding discrete passivation pad and is coupled to the exposed portion of a corresponding I/O contact through the corresponding discrete passivation pad; and
- each of plurality of discrete passivation pads is encapsulated by the first mold compound.

12. The method of claim 10 wherein the passivation layer is formed of benzocyclobutene (BCB) or polyimide.

13. The method of claim 1 further comprising forming at least one window component over the device layer before applying the first mold compound over the device layer, wherein:
- the at least one window component has a height greater than each of the plurality of first bump structures and is not in contact with the plurality of first bump structures; and
- the at least one window component is encapsulated by the first mold compound.

14. The method of claim 13 wherein a portion of the at least one window component is exposed after thinning down the first mold compound.

15. The method of claim 14 further comprising removing the at least one window component to expose a portion of the top surface of the device layer.

16. The method of claim 13 wherein the at least one window component is transparent.

17. The method of claim 1, wherein the precursor wafer further comprises a redistribution structure formed over the device layer, wherein:
- each of the plurality of first bump structures protrudes from a top surface of the redistribution structure;
- the redistribution structure includes redistribution interconnects that connect the plurality of I/O contacts to certain ones of the plurality of first bump structures; and
- the first mold compound resides over the redistribution structure.

18. The method of claim 1, wherein the first mold compound is formed from a same material as the second mold compound.

19. The method of claim 18, wherein:
- the first mold compound and the second mold compound have a thermal conductivity greater than 1 W/m·K; and
- the first mold compound and the second mold compound have a dielectric constant less than 7.

20. The method of claim 1, wherein the first mold compound and the second mold compound are formed from different materials.

21. The method of claim 1, wherein the first mold compound is transparent.

22. The method of claim 1, wherein the stop layer is formed of at least one of silicon oxide or silicon nitride.

* * * * *

UNITED STATES PATENT AND TRADEMARK OFFICE
CERTIFICATE OF CORRECTION

PATENT NO. : 10,490,471 B2
APPLICATION NO. : 15/992639
DATED : November 26, 2019
INVENTOR(S) : Julio C. Costa et al.

Page 1 of 1

It is certified that error appears in the above-identified patent and that said Letters Patent is hereby corrected as shown below:

In the Specification

In Column 1, Line 11, replace "filed May 30, 2019," with --filed May 30, 2018,--.

Signed and Sealed this
Fourth Day of February, 2020

Andrei Iancu
*Director of the United States Patent and Trademark Office*